(12) United States Patent
Khoueir et al.

(10) Patent No.: US 9,123,640 B2
(45) Date of Patent: Sep. 1, 2015

(54) THREE DIMENSIONAL RESISTIVE MEMORY

(71) Applicant: SEAGATE TECHNOLOGY LLC, Cupertino, CA (US)

(72) Inventors: Antoine Khoueir, Apple Valley, MN (US); YoungPil Kim, Eden Prairie, MN (US); Rodney Virgil Bowman, Bloomington, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/892,675

(22) Filed: May 13, 2013

(65) Prior Publication Data

US 2014/0332748 A1   Nov. 13, 2014

(51) Int. Cl.
*H01L 27/24* (2006.01)
*H01L 45/00* (2006.01)

(52) U.S. Cl.
CPC ........ *H01L 27/2481* (2013.01); *H01L 27/2472* (2013.01); *H01L 45/06* (2013.01); *H01L 45/08* (2013.01); *H01L 45/085* (2013.01); *H01L 45/1226* (2013.01); *H01L 45/142* (2013.01); *H01L 45/143* (2013.01); *H01L 45/144* (2013.01); *H01L 45/146* (2013.01); *H01L 45/147* (2013.01)

(58) Field of Classification Search
CPC ........... G11C 13/0026; G11C 2213/71; H01L 27/11578; H01L 27/249; H01L 27/11551; H01L 29/7926; H01L 27/11582; H01L 45/1233; H01L 27/2481; H01L 21/8221

USPC ............................................................ 257/4
See application file for complete search history.

(56) References Cited

U.S. PATENT DOCUMENTS

| | | | |
|---|---|---|---|
| 5,296,716 A * | 3/1994 | Ovshinsky et al. | 257/3 |
| 8,274,068 B2 | 9/2012 | Nagashima | |
| 8,278,642 B2 | 10/2012 | Yoo | |
| 8,937,292 B2 * | 1/2015 | Bateman | 257/5 |
| 2008/0094885 A1* | 4/2008 | Ho et al. | 365/163 |
| 2009/0242966 A1* | 10/2009 | Son et al. | 257/324 |
| 2010/0259962 A1* | 10/2010 | Yan et al. | 365/51 |
| 2011/0049464 A1* | 3/2011 | Lee et al. | 257/4 |
| 2011/0189819 A1* | 8/2011 | Chien et al. | 438/104 |
| 2012/0127779 A1* | 5/2012 | Scheuerlein et al. | 365/148 |
| 2012/0205722 A1* | 8/2012 | Lee et al. | 257/211 |
| 2012/0211722 A1* | 8/2012 | Kellam et al. | 257/4 |
| 2012/0261638 A1 | 10/2012 | Sills | |
| 2013/0093005 A1* | 4/2013 | Yun et al. | 257/329 |

OTHER PUBLICATIONS

Park et al., "A Non-Linear ReRAM Cell with sub-I$\mu$A Ultralow Operating Current for High Density Vertical Resistive Memory (VRRAM)", *IEEE*, 978-1-4673-4871.

* cited by examiner

*Primary Examiner* — Matthew Reames
*Assistant Examiner* — John Bodnar
(74) *Attorney, Agent, or Firm* — Mueting, Raasch & Gebhardt, P.A.

(57) ABSTRACT

A memory device includes a stack of layers comprising a plurality of alternating layers of continuous electrically conductive material word line layers with layers of continuous electrically insulating material. A plurality of vias vertically extend through the stack of layers and a vertical bit line is disposed within each via. A layer of switching material separates the vertical bit line from the stack of layers, thereby forming an array of RRAM cells.

4 Claims, 2 Drawing Sheets

THREE DIMENSIONAL RESISTIVE MEMORY

BACKGROUND

Data storage devices generally operate to store and retrieve data in a fast and efficient manner. Some storage devices utilize a semiconductor array of solid-state memory cells to store individual bits of data. Such memory cells can be volatile (e.g., DRAM, SRAM) or non-volatile (RRAM, STRAM, flash, etc.). As will be appreciated, volatile memory cells generally retain data stored in memory only so long as operational power continues to be supplied to the device, while non-volatile memory cells generally retain data storage in memory even in the absence of the application of operational power.

Non-volatile memory devices may include read-only memory (ROM), magnetic storage, flash memory, resistive random access memory (RRAM), and so forth. In particular, RRAM has become increasing popular due at least in part to its faster write/erase cycles (on the order of nanoseconds (ns)) and lower power consumption relative to conventional DRAM and flash memories, as well as its potential for use in high density memory devices, such as memory devices having memory cells fabricated at nanoscopic dimensions.

As the development of non-volatile memory technologies, including RRAM, continues to trend towards smaller scaling dimensions (e.g., nanoscales), limitations on lithography technology is often recognized as one of several challenging aspects in the design of resistive memory devices and, particularly, resistive memory devices at nanoscopic dimensions.

SUMMARY

The present disclosure relates to new three dimensional resistive random access memory (RRAM) architectures. In particular the present disclosure relates to new resistive random access memory (RRAM) architectures that achieves high memory density with a reduced number of manufacturing steps.

In one illustrative embodiment, a memory device includes a stack of layers comprising a plurality of alternating layers of continuous electrically conductive material word line layers with layers of continuous electrically insulating material. A plurality of vias vertically extend through the stack of layers and a vertical bit line is disposed within each via. A layer of switching material separates the vertical bit line from the stack of layers, thereby forming an array of RRAM cells.

In another illustrative embodiment, a method includes forming a plurality of vias that extend through a thickness of a stack of layers. Each via is defied by an inner surface. The stack of layers include a plurality of alternating layers of continuous electrically conductive material with layers of continuous electrically insulating material. Each continuous electrically conductive material forms a word line plane. Then the method includes depositing a layer of switching material on the inner surface of each via and depositing a vertical bit line on the layer of switching material. Each bit line is electrically isolated from adjacent bit lines to from a memory device. forming an array of RRAM cells.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
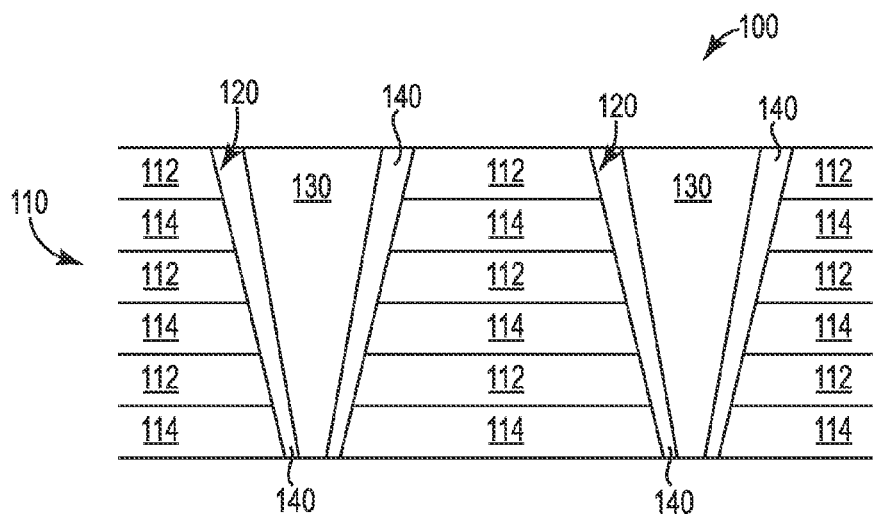
FIG. 1 is a cross sectional view of an exemplary memory device as disclosed herein.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

"Include," "including," or like terms means encompassing but not limited to, that is, including and not exclusive. It should be noted that "top" and "bottom" (or other terms like "upper" and "lower") are utilized strictly for relative descriptions and do not imply any overall orientation of the article in which the described element is located.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

The present disclosure relates to new resistive random access memory (RRAM) architectures that achieves high memory density with a reduced number of manufacturing steps. A plurality of vias vertically extend through a sandwich of conductive word line planes that are separated by an electrically insulating layer. A layer of switching material is disposed on the surface of the via and a vertical bit line is disposed in the via and the switching material separates the vertical bit line from the sandwich of conductive word line planes. In many embodiments the vias define cylindrical or frusto-conical vias. In other embodiments the vias define a longitudinally extending rectangular trenches. In many embodiments each vertical bit line is electrically isolated from the remaining vertical bit lines. While the present disclosure is not so limited, an appreciation of various aspects of the disclosure will be gained through a discussion of the examples provided below.

RRAM is a general classification that may include memory devices based on: (1) oxygen vacancy switching materials, such as binary transition metal oxides (TMO), mixed valence oxides (MVO), and/or complex/conductive metal oxides (CMO) (e.g., providing for filamentary or area-distributed (interfacial) conductive pathways), (2) conductive-bridging RAM (CBRAM) and/or programmable metallization cell (PMC), and (3) phase change memory (PCRAM or PCM). RRAM devices may include an array of memory cells, wherein each memory cell includes first and second electrodes separated by an active material, which may have variable resistive properties and be capable of being switched between different states of electrical resistivity. For instance, the active material, which may include transition-metal oxides and/or chalcogenides, may transition between a high resistive state (an "OFF" state) and a low resistive state (an "ON" state) based upon an applied voltage. In some cases, when the active material transitions to the ON state in response to the applied voltage, conductive pathways, which may resemble a filament or may be area-distributed (e.g., interfacial), may be formed within the active material, thus providing a conductive path (e.g., a short circuit) between the electrodes of the RRAM memory cell. Removing the applied voltage or applying a different voltage (depending on the type of active material being used), may cause the conductive path to break or dispel, thus disconnecting the RRAM memory cell and returning it to the OFF state.

FIG. 1 is a cross sectional view of an exemplary memory device 100 as disclosed herein. The memory device 100 includes a stack of layers 110 including a plurality of alternating layers of continuous electrically conductive material 114 with layers of continuous electrically insulating material 112. Each layer of continuous electrically conductive material forms a word line plane. A plurality of vias 120 vertically extend through the stack of layers 110. A vertical bit line 130 is disposed within each via 120. Each bit line 130 is electrically isolated from adjacent via bit lines 130. A layer of switching material 140 separates the vertical bit line 130 from the stack of layers 110, thereby forming an array of RRAM cells 100. This array of RRAM cells can be referred to as a vertical array of RRAM cells.

Though not depicted in the schematic diagram of FIG. 1, control circuitry can be included to sense the resistive state of the switching material or write to the switching material. In addition, transistors and/or diodes can be utilized to provide a current between the vertical bit lines and the word planes.

The layers of continuous electrically insulating material 112 can be formed of any useful electrically insulating or isolating material such as, oxides or nitrides, for example. Illustrative electrically insulating or isolating material includes silicon oxide, magnesium oxide, alumina, silicon nitride and the like. The continuous electrically conductive material 114 can be formed of any useful electrically conducting material such as, metals, for example. Illustrative electrically conductive material includes tungsten, palladium, titanium, and the like.

Each layer of electrically insulating material 112 and layer of electrically conductive material 114 can have a thickness in a range from 50 to 1000 angstroms, or from 250 to 750 angstroms. The stack of layer 110 can have any number of electrically insulating layers 112 and electrically conductive layers 114. In many embodiments the stack of layer 110 includes at least 16 electrically conductive layers 114 and at least 17 electrically insulating layers 112, or from 16 to 64 electrically conductive layers 114 and at from 17 to 65 electrically insulating layers 112. The via 120 can be formed by any useful method. In many embodiments the via 120 is formed by etching or other lithographic technique.

The layer of switching material 140 of the RRAM memory cells may implement reversible resistive switching via transitioning between a high resistive state (an OFF state) and a low resistive (an ON state) in response to an applied voltage. For instance, the layer of switching material 140 may be normally insulating (exhibiting the high resistive state). When an activating voltage is applied, the memory cell transitions to an ON state, and a conductive path between the electrodes is formed within the layer of switching material 140. When a deactivating voltage is applied (which, in some embodiments, may be a voltage having the same magnitude but opposite polarity with respect to the activating voltage), the conductive path is dispelled or ruptured, thus returning the layer of switching material 140 into an insulating state (the OFF state). Thus, the conductive paths are "reversible" in the sense that they may be formed, broken, and then re-formed depending on an applied voltage.

The layer of switching material 140 includes a material with variable resistive properties, such as transition-metal oxides or chalcogenides having a polycrystalline structure. By way of example only, the layer of switching material 140 can include nickel-oxide (NiO), silver-indium-antimony-tellurium (AgInSbTe), or a GST ($Ge_2Sb_2Te_5$) thin film. In some embodiments, the layer of switching material 140 includes a solid electrolyte, such as a chalcogenide glass having a formula $A_xB_y$, where B is selected from among S, Se and Te and mixtures thereof, and where A includes at least one element from Group iii-A (B, Al, Ga, In, Tl), group IV-A (C, Si, Ge, Sn, Pb), Group V-A (N, P, As, Sb, Bi), or group VII-A (F, Cl, Br, I, At) of the periodic table and with the dopant that may be selected from among the noble metals and transition metals including Ag, Au, Pt, Cu, Cd, Ir, Ru, Co, Cr, Mn or Ni. For example, such solid electrolytes may include $As_xS_{1-x}$—Ag, $Ge_xSe_{1-x}$—Ag, $Ge_xS_{1-x}$—Ag, $As_xS_{1-x}$—Cu, $Ge_xSe_{1-x}$—Cu, $Ge_xS_{1-x}$—Cu, $Ge_xTe_{1-x}$—Cu, $Sn_xSe$, wherein x=0.1 to 0.5, or other doped chalcogenide glasses with Ag, Cu, Zn or with modifiers of halogens, halides or hydrogen (note: x=0.1 to 0.5). In other embodiments, the solid electrolyte may also include undoped or doped oxides with such as $MoO_x$, $TaO_x$, $ZrO_x$, $HfO_x$, $TiO_x$, $MgO_x$, $NbO_x$, $AlO_x$, $GdO_x$, $NiO_x$ $GeO_2$, $As_2O_3$, $Ag_2O$, $Cu_{(1,2)}O$, $WO_x$ or other suitable transition metal oxides. In other embodiments, the active layer may include any suitable rare earth metal oxide, $SiO_x$, amorphous or crystalline Si, $Zn_xCd_{(1-x)}S$, amorphous C, CuC, or $Cu_2S$.

Additionally, the active layer may include a mixed valence oxide (MVO) (sometimes also referred to as complex metal oxides or conductive metal oxides). For instance, the active layer may include a complex metal oxide having a Perovskite structure. An example of a complex metal oxide having a Perovskite structure may be PCMO (PrCaMnO, or more specifically expressed as $Pr_{0.7}Ca_{0.3}MnO_3$).

The layer of switching material 140 can have any useful thickness. In many embodiments, the layer of switching material 140 has a thickness in a range from 5 to 500 angstroms or from 10 to 250 angstroms. As illustrated in FIG. 1, the layer of switching material 140 can be a continuous layer of material that extend from a bottom portion of the via 120 to a top portion of the via 120.

The vertical bit lines 130 can be formed of any useful electrically conducting material such as, metals, for example. Illustrative electrically conductive material includes tungsten, palladium, titanium, and the like. As illustrated in FIG. 1, the vertical bit lines 130 can be a continuous column of material that extend from a bottom portion of the via 120 to a top portion of the via 120 and is in direct contact with the continuous layer of switching material 140.

Figure 2:
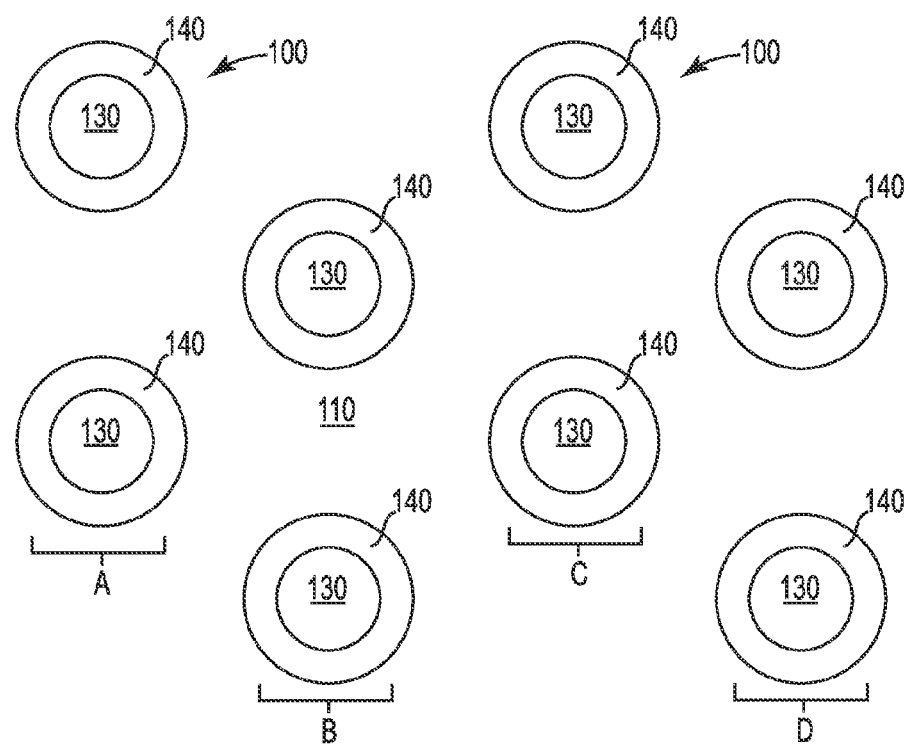
FIG. 2 is a top down schematic view of an exemplary memory array having cylindrical vias.

FIG. 2 is a top down view of an exemplary memory array having cylindrical vias. This view illustrates four rows (A, B, C, D) of vertical memory devices 100. The vias in this embodiment form vertically extending (into the paper) cylindrical or frusto-conical vias. These vias can have an aspect ratio from 50:1 (vertical depth:diameter) to 1:1. The diameter of the via can be in a range from 20 to 100 nanometers. The layer of switching material 140 forms an annular vertically extending shape that separates the vertical bit line 130 from the stack of layers 110. The word planes in the stack of layers 110 is continuous and electrically connects all of the vertical memory devices 100.

The plurality vertical memory devices 100 are arranged in longitudinal rows (A, B, C, D) and adjacent rows are offset from each other forming a chambered (or honeycomb) arrangement. This chambered arrangement increases the density of the vertical memory devices 100. The vertical bit lines 130 that form a longitudinal row (A or B or C or D) are electrically isolated from each other as well as being electrically isolated from vertical bit lines 130 in adjacent rows. While each row illustrates two vertical memory devices 100, it is understood that each row can have any useful number of vertical memory devices 100 such as more than 10, or more than 100 or more than 1000.

Figure 3:
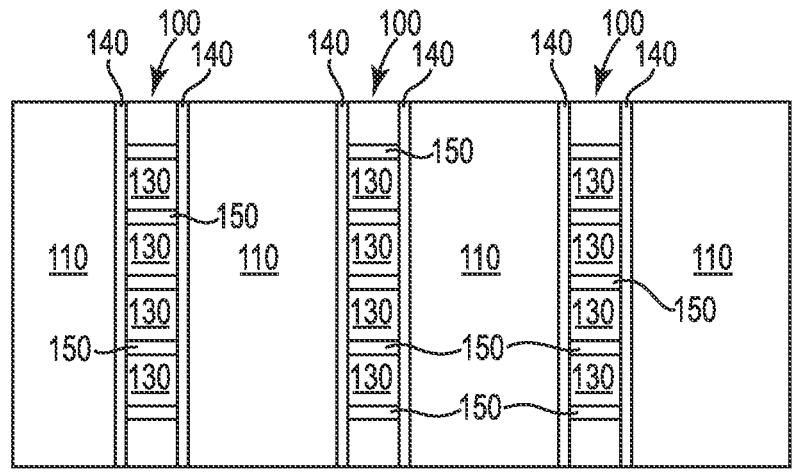
FIG. 3 is a top down schematic view of an exemplary memory array having rectangular trench vias.

FIG. 3 is a top down view of an exemplary memory array having rectangular trench vias. This view illustrates three rows of vertical memory devices 100. The vias in this embodiment form longitudinally extending rectangular trench vias that vertically extend into the paper. These vias can have an aspect ratio from 50:1 (vertical depth:width) to 1:1. The length of the longitudinally extending rectangular trench vias can be any useful dimension. The width of the via can be in a range from 20 to 100 nanometers. The layer of switching material 140 forms parallel layers that separates the vertical bit line 130 from the stack of layers 110. The word planes in the stack of layers 110 is continuous in the longitudinally extending direction and electrically connects all of the vertical memory devices 100 of adjacent rows of vertical memory devices 100.

In many embodiments, the longitudinally extending rectangular trench vias further includes a plurality of vertically extending layers of electrically insulating material 150 separating the parallel layers of switching material 140 and separating the vertical bit line 130 into a plurality of vertical bit lines 130 longitudinally extending along the rectangular trench via. The electrically insulating material 150 can be formed of any useful electrically insulating or isolating material such as, oxides or nitrides, for example. Illustrative electrically insulating or isolating material includes silicon oxide, magnesium oxide, alumina, silicon nitride and the like. The vertical bit lines 130 that form a longitudinal row are electrically isolated from each other as well as being electrically isolated from vertical bit lines 130 in adjacent rows. While each row illustrates four vertical memory devices it is understood that each row or trench can have any useful number of vertical memory devices such as more than 10, or more than 100 or more than 1000.

Figure 4:
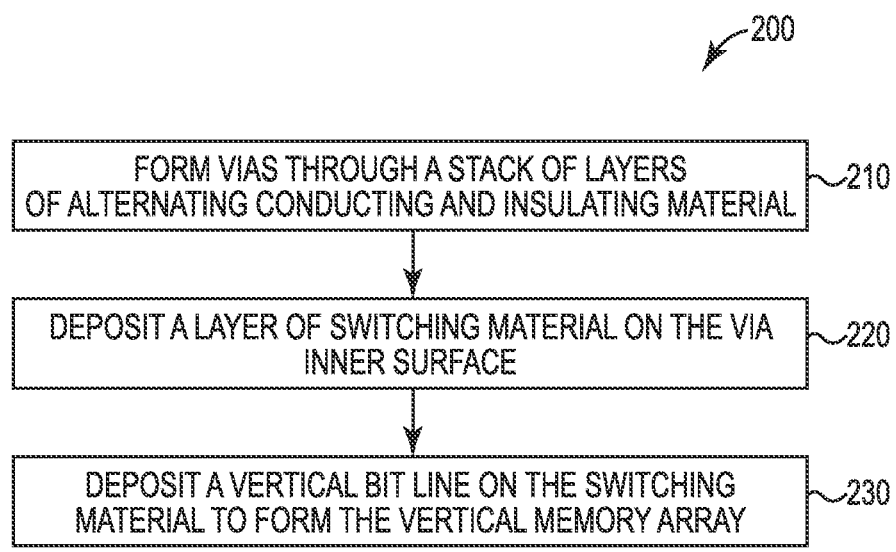
FIG. 4 is a flow diagram of forming the memory arrays as disclosed herein.

FIG. 4 is a flow diagram of forming the memory arrays as disclosed herein. The method 200 includes forming a plurality of vias that extend through a thickness of a stack of layers at step 210. Each via is defined by an inner surface. The stack of layers include a plurality of alternating layers of continuous electrically conductive material with layers of continuous electrically insulating material. Each continuous electrically conductive material forms a word line plane. Then the method includes depositing a layer of switching material on the inner surface of each via at step 220 and depositing a vertical bit line on the layer of switching material at step 230. Each bit line is electrically isolated from adjacent bit lines to from a memory device, forming an array of RRAM cells.

An exemplary method includes a first step of forming, depositing or obtaining a stack of layers 110. The stack 110 generally includes alternating layers of insulating material and conductive material, as described above. The stack 110 can also be described as a bilayer stack of alternating insulating material (for example silica ($SiO_2$), or alumina ($Al_2O_3$)) and conductive material (for example metal. Deposition of the stack 110 can be accomplished using methods such as physical vapor deposition (PVD), chemical vapor deposition (PVD), or atomic layer deposition (ALD). In some embodiments, the stack 110 can be formed using a low pressure (LP) CVD method.

The step of forming voids 120 can generally be accomplished by etching, for example by using chemical etching methods such as chloride (—Cl) based chemistries, for example boron trichloride ($BCl_3$), hydrogen based etching ($H_2$), fluorine based etching, for example sulfur hexafluoride ($SF_6$), or oxygen based etching ($O_2$). Alternatively, dry etching methods can be utilized. The step of depositing the switching material 140 and vertical bit lines 130 can generally be accomplished, for example by using methods such as physical vapor deposition (PVD), chemical vapor deposition (CVD), or atomic layer deposition (ALD).

The electrically insulating material 150 can generally be any electrically insulating or electrically isolating material. Exemplary materials can include for example silica ($SiO_2$), and alumina ($Al_2O_3$). The step of depositing the electrically insulating material 150 can generally be accomplished, for example by using methods such as physical vapor deposition (PVD), chemical vapor deposition (CVD), or atomic layer deposition (ALD).

Other optional methods, not depicted herein can include additional steps that can be designed, for example to form additional vertical stacks and or additional rows within a memory array.

Thus, embodiments of THREE DIMENSIONAL RESISTIVE MEMORY are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

What is claimed is:
1. A memory device comprising:
 a stack of layers comprising a plurality of alternating layers of continuous electrically conductive material with lay- ers of continuous electrically insulating material, each layer of continuous electrically conductive material forming a word line plane;

a plurality of vias vertically extending through the stack of layers, wherein the plurality of vias comprise longitudinally extending rectangular trench vias;

a vertical bit line disposed within each via, wherein each bit line is electrically isolated from adjacent via bit lines; and a layer of switching material separating each longitudinally extending rectangular trench via from the stack of layers, thereby forming an array of RRAM cells, wherein the layer of switching material comprises chalcogenide glass.

2. The memory device according to claim 1, wherein the layer of switching material forms parallel layers that separate the vertical bit line from the stack of layers.

3. The memory device according to claim 2, further comprising a plurality of vertically extending layers of electrically insulating material separating the parallel layers of switching material and separating the vertical bit line into a plurality of vertical bit lines longitudinally extending along the rectangular trench via.

4. The memory device according to claim 3, wherein the vertical bit lines longitudinally extending along the rectangular trench via are electrically isolated from each other.

* * * * *